(12) United States Patent
Rusconi Clerici Beltrami et al.

(10) Patent No.: US 10,812,905 B2
(45) Date of Patent: Oct. 20, 2020

(54) DEVICE FOR AUDIO SIGNAL PROCESSING FOR A PIEZOELECTRIC SPEAKER

(71) Applicant: USound GmbH, Graz (AT)

(72) Inventors: Andrea Rusconi Clerici Beltrami, Vienna (AT); Ferruccio Bottoni, Graz (AT); Drago Strle, Ljubljana (SI)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 16/509,997

(22) Filed: Jul. 12, 2019

(65) Prior Publication Data

US 2020/0021914 A1    Jan. 16, 2020

(30) Foreign Application Priority Data

Jul. 12, 2018   (DE) .................. 10 2018 116 924

(51) Int. Cl.
| | |
|---|---|
| H04R 25/00 | (2006.01) |
| H04R 3/06 | (2006.01) |
| H01L 41/04 | (2006.01) |
| H03F 3/181 | (2006.01) |
| H04R 17/00 | (2006.01) |
| H04R 19/02 | (2006.01) |

(52) U.S. Cl.
CPC ............. *H04R 3/06* (2013.01); *H01L 41/042* (2013.01); *H03F 3/181* (2013.01); *H04R 17/00* (2013.01); *H04R 19/02* (2013.01)

(58) Field of Classification Search
CPC ....... H01L 41/042; H03F 3/181; H04R 17/00; H04R 19/02; H04R 3/06
USPC ....................................................... 381/190
See application file for complete search history.

(56) References Cited

U.S. PATENT DOCUMENTS

| | | | |
|---|---|---|---|
| 7,355,472 B2 | 4/2008 | Kranz | |
| 9,577,663 B1 | 2/2017 | Paton Alvarez | |
| 2007/0124620 A1 | 5/2007 | Miyazaki | |
| 2010/0271147 A1 | 10/2010 | Leibman | |

(Continued)

FOREIGN PATENT DOCUMENTS

| | | |
|---|---|---|
| DE | 10393487 | 5/2007 |
| JP | S62-123899 | 6/1987 |

(Continued)

OTHER PUBLICATIONS

EP Search Report and English Translation thereof, EP Application No. 19186136.8-1207, dated Nov. 28, 2019, 12 pages.

(Continued)

*Primary Examiner* — Phylesha Dabney
(74) *Attorney, Agent, or Firm* — Dority & Manning, P.A.

(57) ABSTRACT

A device and a method for audio signal processing for a piezoelectric speaker for generating sound waves in the audible wavelength spectrum includes a signal input for a digital audio signal, a digital correction unit for correcting a nonlinearity of the speaker, a digital PWM generator that converts the signal corrected by the correction unit into a pulse-width modulated switch signal, a power stage controllable by the switch signal such that the speaker can be charged with a voltage for deflecting a membrane, and a closed-loop control circuit that feeds the voltage back as a feedback signal, which includes a first signal noise in the audible frequency range. The closed-loop control circuit of the device includes a noise shaping unit in that shifts a noise energy of the first signal noise outside of the audible frequency range.

20 Claims, 3 Drawing Sheets

(56) References Cited

U.S. PATENT DOCUMENTS

2016/0065237 A1 3/2016 Danneels
2019/0253026 A1 8/2019 Rusconi Clerici Beltrami

FOREIGN PATENT DOCUMENTS

| WO | WO 92/15153 | 9/1992 |
| WO | WO 2004/049560 | 6/2004 |
| WO | WO 2011/159346 | 12/2011 |
| WO | WO 2012/070042 | 5/2012 |
| WO | WO 2018/077922 | 5/2018 |

OTHER PUBLICATIONS

German Search Report and English Translation thereof, Application No. 10 2018 116 924.8, Apr. 10, 2019, 15 pages.

DEVICE FOR AUDIO SIGNAL PROCESSING FOR A PIEZOELECTRIC SPEAKER

FIELD OF THE INVENTION

The present invention relates to a device for audio signal processing for a piezoelectric speaker for generating sound waves in the audible wavelength spectrum. The device includes a noise shaping unit in a closed-loop control circuit, by means of which a signal noise in the audible frequency range during normal operation caused by the correction unit, the PWM generator, the power stage, and/or the piezoelectric speaker can be eliminated. The present invention further relates to a method for audio signal processing for a piezoelectric speaker for generating sound waves in the audible wavelength spectrum.

BACKGROUND

A device for operating a piezoelectric speaker is known from US 2010/0271147 A1, which is hereby incorporated herein by this reference for all purposes. A disadvantage thereof is that a sound quality of the speaker is not sufficient.

BRIEF OBJECTS AND SUMMARY OF THE INVENTION

The object of the present invention is thus to improve the sound quality of the sound waves emitted by the piezoelectric speaker.

The object is achieved by a device for audio signal processing for a piezoelectric speaker and an associated method having the features described below.

The invention proposes a device for audio signal processing for a piezoelectric speaker for generating sound waves in the audible wavelength spectrum. The audible wavelength spectrum for humans ranges from approximately 20 Hz to 20 kHz, wherein said range can vary from person to person and can particularly depend on the age of the person. Lower and higher frequencies are not perceptible to the human ear.

The device comprises a signal input for a digital audio signal. The audio signal can comprise music, sounds, and/or speech, for example, originating from a smartphone, an MP3 player, or another device. The audio signal is therein fed into the device via the signal input in order to be output by the piezoelectric speaker.

The device further comprises a digital correction unit for correcting a nonlinearity of the speaker. The digital correction unit can receive the digital audio signal from the signal input. The digital correction unit can thus be connected downstream of the signal input in the direction of signal flow. The nonlinearities become evident in that a change in the digital audio signal is not linearly proportional to a change in the sound output by the piezoelectric speaker. This can be substantially explained by the fact that the piezoelectric comprises a complex, nonlinear behavior. Temperature changes in the device and/or the piezoelectric speaker can also lead to nonlinearities. By means of the digital correction unit, the nonlinearities can be reduced, so that a sound quality of the piezoelectric speaker can be improved.

The device further comprises a digital PWM generator by means of which the signal corrected by the correction unit can be converted into a pulse-width modulated switch signal. The digital PWM generator can thus be connected downstream of the digital correction unit in the direction of signal flow.

The device further comprises a power stage able to be actuated by means of the switch signal converted by the PWM generator, such that a piezoelectric actuator of the speaker can be charged with a voltage for deflecting a membrane. The power stage can be connected downstream of the PWM generator in the direction of signal flow. The power stage can comprise an amplifier unit able to charging and discharging the piezoelectric actuator of the speaker with a voltage. The power stage can provide an output signal so that the speaker can output a sound corresponding to the digital audio signal, possibly comprising music, sound, and/or tones. The power stage can also comprise at least one switch for processing the switch signal of the PWM generator.

The piezoelectric speaker can be at least partially charged with electrical energy from an energy unit by the power stage and then at least partially discharged, thereby generating sound waves. The electrical energy can therein be provided by the energy unit. The piezoelectric speaker comprises piezoelectric properties, that is, the piezoelectric speaker can be deflected as a function of the charge state thereof. The greater the charge of the piezoelectric speaker with electrical energy, the greater the deflection of the piezoelectric speaker. The sound waves can be generated by means of the deflection of the piezoelectric speaker if the deflection is transmitted to the membrane, for example. The air disposed above the membrane can thereby be set to vibrating so that the sound waves are generated. The deflection of the piezoelectric speaker can further be modified in that said actuator is charged and discharged. If the piezoelectric speaker is charged further, the deflection can be increased. In order to reduce the deflection, in contrast, the piezoelectric speaker can be discharged. The piezoelectric speaker can thus be set to vibrating by alternately charging and discharging, wherein the vibrations are transmitted to the membrane, for example, such that the sound waves are generated. The piezoelectric speaker can therein be incrementally charged and discharged.

Sound waves can thus be generated by the controlled deflection of the piezoelectric speaker. If the deflection occurs according to the digital audio signal, for example comprising tones, sounds, or music, a corresponding noise, also comprising tones, sounds, or music, is generated by means of the piezoelectric speaker. The audio signal can be present in the form of a music file, for example. The audio signal can also be provided by a conversational partner on a phone call, for example.

By charging and discharging with electrical energy, an electrical voltage at the piezoelectric speaker also rises and falls. As the voltage at the piezoelectric speaker increases, the deflection rises. The deflection further falls as the voltage at the piezoelectric speaker drops. The piezoelectric speaker further has a capacitance, as an electrical field is established by the charging of the piezoelectric speaker with electrical energy as a function of the electrical voltage. The piezoelectric speaker can thus comprise properties of a capacitor. The charge state and the electrical voltage of the piezoelectric speaker and the displacement can also be interdependent.

The power stage can be a voltage transformer, for example. By means of the power stage, the piezoelectric actuator can be charged to 30V, for example, even if only 3V is made available by an energy source, such as a battery. The power stage can therein charge the piezoelectric actuator Incrementally or in cycles. The charging of the piezoelectric actuator therein depends on the digital audio signal.

In addition or alternatively, the power stage can also discharge the piezoelectric actuator. This can be performed if the deflection of the membrane is to be reduced. A lesser deflection of the piezoelectric actuator therein corresponds to a lesser deflection of the membrane. The electrical energy released by discharging can therein be stored in the energy source again.

The device further comprises a feedback implementing a closed-loop control circuit, by means of which the voltage of the piezoelectric actuator can be fed back as a feedback signal, wherein the feedback signal comprises a signal noise in the audible frequency range during normal operation caused by the correction unit, the PWM generator, the power stage, and/or the piezoelectric speaker. The feedback thus closes the closed-loop control circuit, so that the sound quality of the speaker can be improved. The feedback can feed back the feedback signal upstream of the digital correction unit, particularly in the direction of signal flow.

The first signal noise leads to reduced sound quality of the piezoelectric speaker. The first signal noise can be caused, for example, in that the digital audio signal is converted into an analog voltage for the piezoelectric actuator from the signal input, through the correction unit, through the PWM generator, through the power stage, and to the piezoelectric actuator. This can only be performed with finite precision, however, as the PWM generator for example can convert the signal corrected by the correction unit into the switch signal with some imprecision. The PWM generator can comprise quantization noise, for example. In addition or alternatively, the correction unit, the power stage, and/or the piezoelectric speaker can comprise the quantization noise. The precision of the correction unit, the PWM generator, and/or the power stage can be only 8 bits, for example, leading to the device being compact in design. Such a resolution, however, can lead to said quantization errors and to quantization noise. In addition, the remaining nonlinearity also reduces the quality of the audio signal and/or of the sound generated by the speaker.

According to the invention, the device comprises a noise shaping unit designed and/or implemented in the closed-loop control circuit such that a noise energy of the first signal noise of the correction unit, the PWM generator, the power stage, and/or the piezoelectric speaker can be shifted outside of the audible frequency range by means of said unit. Outside of the audible frequency range, humans can no longer perceive the first signal noise, so that the sound quality of the speaker is improved.

It is advantageous if the noise energy of the first signal noise can be shifted into a high-frequency range by means of the noise shaping unit. The high-frequency range can be above 20 kHz, for example, wherein humans can no longer perceive the first signal noise. In addition or alternatively, the noise shaping unit can also shift the noise energy of the first signal noise into the range of a system sampling frequency of the device. The system sampling frequency can be in the range of 1 MHz, for example. The system sampling frequency can therein be the working frequency of the device. That is, the system sampling frequency can be the frequency at which the device works, particularly at which cycle time the device processes the audio signal.

The sound quality can thereby be improved. If the noise energy is shifted into a high-frequency range, the piezoelectric actuator itself also attenuates such frequencies. As the piezoelectric actuator comprises a certain mass, said actuator has a corresponding inertia. The piezoelectric actuator can no longer track higher frequencies, so said high frequencies are damped by the piezoelectric actuator itself. The piezoelectric actuator can act as a low-pass filter itself.

It is advantageous if the device is implemented as a closed-loop control circuit. The closed-loop control circuit can be computer-implemented. The closed-loop control circuit can then be implemented by a computer program. In addition or alternatively, the closed-loop control circuit can also be an electronic closed-loop control circuit, so that the closed-loop control circuit is disposed in an ASIC, for example.

In addition or alternatively, the closed-loop control circuit can also comprise a forward path. The forward path can comprise the signal input, the digital correction unit, the PWM generator, the power stage, and/or the piezoelectric speaker, for example. Said items can be disposed in the direction of signal flow indicated here.

In addition or alternatively, the closed-loop control circuit can also comprise at least one feedback path. The feedback path can feed back the feedback signal, potentially comprising the voltage of the piezoelectric actuator, so that the closed-loop control circuit is closed.

It is advantageous if the noise shaping unit is connected upstream of the correction unit in the direction of signal flow. The correction unit thereby receives the signal shaped by the noise shaping unit, in which the noise energy is shifted outside of the audible wavelength spectrum. The noise shaping unit can therein be connected upstream of the correction unit in the direction of signal flow in the forward path, for example.

It is advantageous if the noise shaping unit comprises a noise shaping block for shifting the noise energy of the first signal noise. The noise shaping block can be optimized for shifting the noise energy of the first signal noise outside of the audible wavelength spectrum.

In addition or alternatively, the noise shaping unit can comprise a loop filter for suppressing the quantization noise and/or a remaining nonlinearity after the correction unit and/or the PWM generator and thus improving the quality of the sound.

It is advantageous if the loop filter is connected upstream of the noise shaping block in the direction of signal flow. In addition or alternatively, the loop filter can be connected upstream of the correction unit in the direction of signal flow.

It is advantageous if the device comprises an analog/digital converter by means of which the feedback signal can be digitalized, wherein the converted digital feedback signal comprises a second signal noise caused by the analog/digital converter during normal operation. The analog/digital converter is also abbreviated as an A/D converter, wherein here as well this abbreviation is used. The feedback signal can be digitalized by means of the A/D converter, so that said signal can be processed in an electronic and/or logical circuit. As every A/D converter has a finite resolution, errors also occur during digitalization, particularly quantization errors or quantization noise. The A/D converter thus generates the second signal noise.

It is advantageous if the A/D converter is disposed in the feedback path. The A/D converter is connected downstream of the piezoelectric speaker in the direction of signal flow.

It is advantageous if the noise shaping block is implemented so as to process only the first signal noise. The noise shaping block thus does not process the second signal noise. For example, the first signal noise can be greater than the second signal noise, so that it is more effective to process only the first signal noise. The second signal noise can also be reduced and thus neglected if the A/D converter has sufficiently high resolution. The A/D converter can have a resolution of 12, 14, or 16 bits, for example.

It is advantageous if the noise shaping unit comprises a signal transfer function by means of which an actuating variable for actuating the speaker can be determined using a control deviation between the digital audio signal and the digital feedback signal. The actuating variable can be a voltage for actuating the speaker. The actuating variable can also be a voltage differential by means of which the piezoelectric speaker is charged or discharged. The control deviation indicates the deviation between an actual value of the voltage of the piezoelectric actuator, namely the digital feedback signal, and the specified value of the piezoelectric actuator depending on the digital audio signal. If the control deviation is zero, then the piezoelectric actuator has the voltage that said actuator should have according to the digital audio signal. The piezoelectric actuator thus emits the audio signal without error. The piezoelectric actuator, however, comprises the first and/or second signal noise. The first signal noise particularly leads to an error able to be determined by the control deviation. The control deviation can be formed as the difference between the digital audio signal and the digital feedback signal, for example. The actuating variable for actuating the speaker can be determined therefrom by means of the signal transfer function, so that the error is avoided. The actuating variable can be a voltage. The control deviation is therein the input signal and the actuating variable is the output signal.

It is advantageous if the signal transfer function is implemented such that the control deviation can be delayed by one period by means of such function. The period can advantageously be a period of the system sampling frequency or of the working frequency of the device. The control thereby affects the next subsequent period, for example the feedback of the feedback signal.

It is advantageous if the signal transfer function $STF_d$ is defined by the following first formula:

$$STF_d = \frac{X}{d} = \frac{H(z)}{[1 + I(z)*(1 + K(z))H(z)]}$$

wherein H(z) is the system function, I(z) is the speaker function, K(z) is the inverse function of I(z), d is the control deviation, and X is the actuating variable for the speaker. The signal transfer function is defined by d as the input variable or signal and X as the output variable or signal. For a system function H(z), the signal transfer function $STF_d$ can be $z^{-1}$. For other system functions H(z) the transfer function $STF_d$ can be different depending to the needs. The signal transfer function $STF_d$, for example, can also have higher orders.

It is advantageous if the noise shaping unit comprises a noise shaping transfer function by means of which the noise energy of the first signal noise can be shifted. The noise shaping transfer function can therein be implemented so as to shift the noise energy of the first signal noise into the inaudible wavelength spectrum, particularly to frequencies above 20 kHz, preferably into a range of the system sampling frequency.

It is advantageous if the noise shaping transfer function is implemented such that low frequencies are damped by means thereof. Said frequency range comprising the noise energy is particularly damped, so that the sound quality is improved.

It is advantageous if the noise shaping transfer function $NTF_d$ is defined by the following second formula:

$$NTF_d = \frac{X}{Q_z} = \frac{1}{[1 + I(z)*(1 + K(z))H(z)]}$$

wherein H(z) is the system function, I(z) is the speaker function, K(z) is the inverse function of I(z), d is the control deviation, and X is the actuating variable for the speaker. Q(z) can be the disturbance variable of the digital correction unit, of the PWM generator, of the power stage, and/or of the piezoelectric speaker. Q(z) therein describes, for example, the quantization error arising from the PWM generator. The first signal noise can be defined by means of Q(z), for example. Q(z) can comprise all errors, for example, occurring in the processing of the digital audio signal up to actuation, for example an output signal of the piezoelectric actuator. Q(z) can comprise the first signal noise. Q(z) corresponds to the input signal and X to the output signal in the noise shaping transfer function. For a system function H(z) the noise shaping transfer function $NTF_d$ can be $1-z^{-1}$. For other system functions H(z) the noise shaping transfer function $NTF_d$ can be different depending to the needs. The signal transfer function $NTF_d$, for example, can also have higher orders.

It is advantageous if the actuating variable transfer function is defined by the following third formula:

$$X(z) = d*STF_d + Q_z*NTF_d$$

Said third formula comprises the signal transfer function as $STF_d$ and the noise shaping transfer function as $NTF_d$. The control deviation corresponds to d and Q(z) to the first signal noise or the quantization error. For a system function H(z) X(z) can be $z^{-1}*d + Q_z*(1-z^{-1})$. For other system function H(z) X(z) can be different depending to the needs.

It is advantageous if a controlled variable transfer function is defined by the following fourth formula:

$$Y(Z) = V_{in}\frac{STF_d*I(z)}{(1 + STF_d*I(z))} + Q_z\frac{NTF_d*I(z)}{(1 + NTF_d*I(z))}$$

wherein $V_{in}$ is the digital audio signal. For a system function H(z) Y(z) can be $z^{-1}*V_{in} + Q_z*(1-z^{-1})$. For other system function H(z) Y(z) can be different depending to the needs.

It is advantageous if the noise shaping unit is implemented such that zeroes, poles, and/or the order of at least one transfer function can be determined thereby such that a signal-to-noise ratio is increased. In addition or alternatively, the noise shaping unit is implemented such that zeroes, poles, and/or the order of at least one transfer function can be determined therein such harmonic distortion is decreased. The sound quality is thereby improved.

It is advantageous if the device comprises a control unit in which the signal transfer function, the noise shaping transfer function, the actuating variable transfer function, and/or the controlled variable transfer function are implemented. The device can also comprise a microcontroller in which the signal transfer function, the noise shaping transfer function, the actuating variable transfer function, and/or the controlled variable transfer function are implemented.

It is advantageous if measurement data for a standardized piezoelectric speaker reflecting the nonlinear behavior thereof is saved in the digital correction unit. The measurement data can be saved in a table, for example. The measurement data can further comprise the capacitance of the piezoelectric speaker, for example, preferably saved as a function of the charge of the piezoelectric speaker. The measurement data can therein comprise data characterizing the behavior of the piezoelectric speaker. The measurement data can, however, also comprise values for the correction unit, for the PWM generator, and/or for the power stage. The measurement data can comprise values, for example, for capacitances, inductivities, and/or characteristic curves. It can therein be determined, for example, how long the piezoelectric speaker or piezoelectric actuator must be charged in order to obtain a particular deflection of the membrane of the piezoelectric speaker corresponding to an audio signal. The measurement data can comprise system parameters of the device.

It is further advantageous if at least part of the nonlinearity of the speaker can be corrected under consideration of said measurement data. The sound quality of the piezoelectric speaker is thereby improved.

The invention further proposes a method for audio signal processing for a piezoelectric speaker for generating sound waves in the audible wavelength spectrum. The device implemented according to one or more features of the preceding and/or following description can therein be operated by means of the method.

According to the method, a digital audio signal fed in via a signal input is processed. The sound is generated by the speaker by means of the digital audio signal. The digital audio signal comprises information about music, tones, and/or speech to be reproduced by the speaker. The method processes the digital audio signal so that the speaker can convert the information stored in the audio signal about the music, the tones, and/or the speech into the corresponding sound.

According to the method, a nonlinearity of the speaker is corrected by a digital correction unit. As the speaker cannot react linearly to the audio signal, the nonlinearities are corrected by means of the correction unit. Said nonlinearities can be cause, for example, as the speaker reacts differently to different conditions. For example, the piezoelectric speaker has a capacitance depending on the momentary charge state of the piezoelectric speaker. The correction unit can incorporate in the calculation the momentary state, for example the charge state, of the piezoelectric speaker in order to correct the nonlinearities. The temperature of the piezoelectric speaker can also lead to nonlinearities. Different temperatures can lead to different behavior. The age of the piezoelectric speaker can also lead to nonlinearities. An older speaker can react differently to a signal than a newer speaker.

The signal corrected by the correction unit is further converted into a pulse-width modulated switch signal by a digital PWM generator.

A power stage is actuated by means of the switch signal converted by the PWM generator, such that a piezoelectric actuator of the speaker is charged with a voltage for deflecting a membrane. When the membrane is deflected, the air disposed above the membrane is induced to vibrate, corresponding to sound waves transmitting the tones, the music, and/or the speech. As a result, deflecting the membrane correctly is important. Incorrectly deflecting the membrane causes sound waves transmitting distorted or erroneous speech, tones, and/or speech. In order to achieve a high sound quality, it is advantageous that the deflection correspond as well as possible to the digital audio signal.

The membrane can therein be deflected incrementally when the piezoelectric actuator is charged incrementally. This can be performed, for example, if an energy source, such as a battery, comprises a supply voltage of 3 V, but the piezoelectric actuator is charged at up to 30 V.

The power stage can comprise at least one switch, for example, actuated by the pulse-width modulated switch signal of the PWM generator. The piezoelectric actuator is thereby charged with a voltage potentially having an analog value. The correction unit, the PWM generator, and/or the power stage can thus convert the digital audio signal into a voltage of the piezoelectric actuator, wherein the voltage has an analog value. The correction unit, the PWM generator, and/or the power stage can thus act as a digital/analog converter.

The voltage of the piezoelectric actuator is further fed back as a feedback signal via a feedback of a closed-loop control circuit. The feedback signal therein comprises a first signal noise in the audible frequency range during normal operation caused by the correction unit, the PWM generator, the power stage, and/or the piezoelectric speaker. The feedback thus closes the closed-loop control circuit. The sound quality of the piezoelectric speaker is improved by means of the closed-loop control circuit. For example, errors in the output sound arising from errors in the signal processing of the correction unit, of the PWM generator, of the piezoelectric speaker, and/or of the power stage can be minimized by means of the closed-loop control circuit.

According to the invention, a noise energy of the first signal noise of the correction unit, of the PWM generator, of the power stage, and/or of the piezoelectric speaker is shifted out of the audible frequency range by means of the noise shaping unit. The noise energy can therein be shifted into a range above the audible frequency range. For example, the noise energy can be shifted above a frequency of 20 kHz. In such a frequency range, the human ear can no longer perceive the first signal noise, so that the sound quality of the sound output by the speaker is improved. Alternatively, the noise energy can also be shifted into range of the system sampling frequency. The system sampling frequency can also be the working frequency of the method for audio signal processing and lie in a range of 1 MHz, for example. In such a frequency range, the piezoelectric actuator or speaker has an inertia, so that the piezoelectric actuator or speaker can no longer follow said frequency. The noise energy of the first signal noise is thereby damped. The piezoelectric actuator or speaker have properties of a low-pass filter.

BRIEF DESCRIPTION OF THE DRAWINGS

Further advantages of the invention are described in the embodiment examples below. In the drawings.

DETAILED DESCRIPTION OF THE EXEMPLARY EMBODIMENTS

Figure 1:
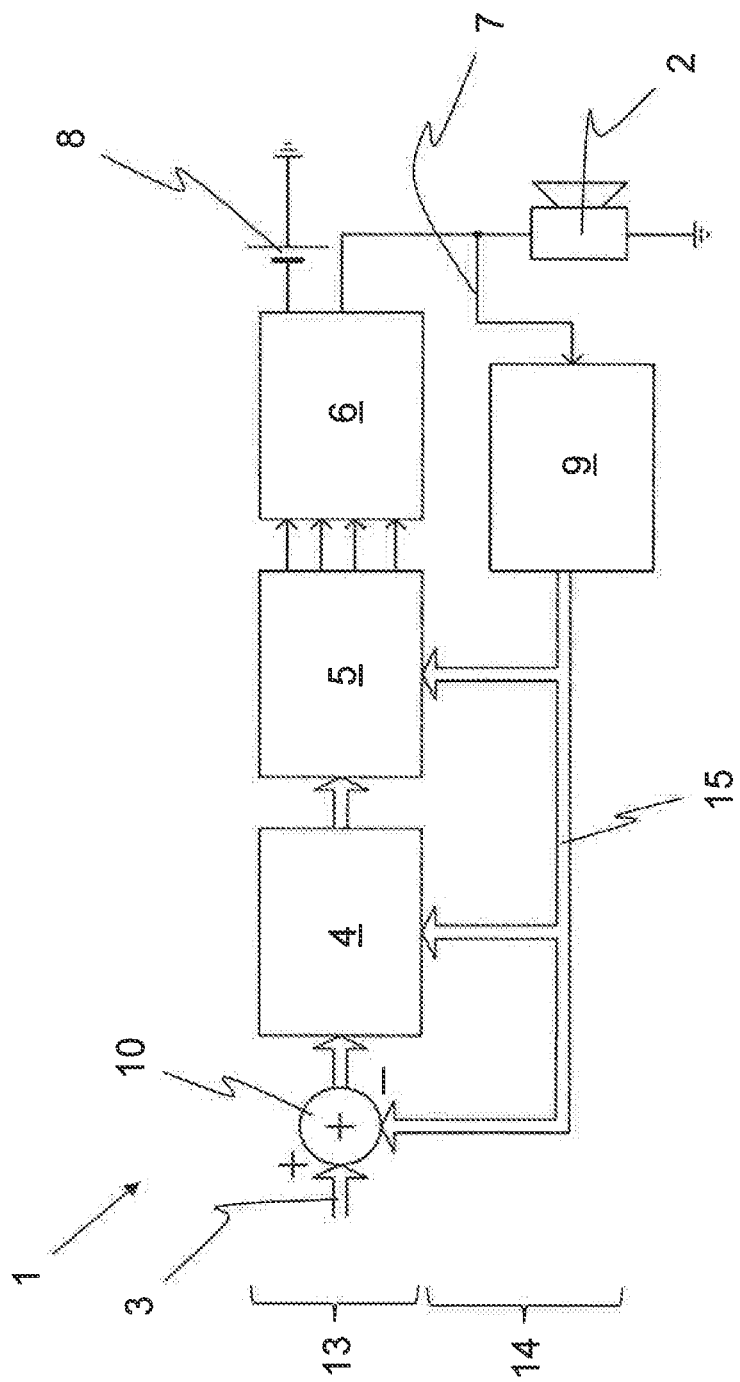
FIG. 1 A block circuit diagram of a device for audio signal processing for a piezoelectric speaker, FIG. 2 A block circuit diagram of a device for audio signal processing for a piezoelectric speaker having a noise shaping unit, and FIG. 3 A flow chart of the linear model for signal processing for a piezoelectric speaker.

FIG. 1 shows a block circuit diagram of a device 1 for audio signal processing for a piezoelectric speaker 2. Sound waves in the audible wavelength spectrum can be produced by means of the piezoelectric speaker 2 and can be perceived by the human ear. The sound waves can comprise tones, music, and/or speech, so that music can be listened to or telephone calls made by means of the speaker 2, for example. The device 1 and the speaker 2 can thus be disposed in a smartphone, in an MP3 player, or in another, particularly portable, device.

The piezoelectric speaker 2 comprises a piezoelectric actuator not shown here, by means of which a membrane, also not shown here, of the speaker 2 can be deflected in order to induce vibrations in air above the membrane, so that the sound waves are generated for transporting the tones, the music, and/or the speech.

In order to deflect the piezoelectric actuator, said actuator can be charged with an electrical voltage. When the electrical voltage of the piezoelectric actuator rises and falls, the deflection thereof also increases and decreases. By charging the piezoelectric actuator, electrical energy can be stored therein, so that the actuator comprises properties of a capacitor and has a capacitance.

The device 1 further comprises a signal input 3 for a digital audio signal. The digital audio signal comprises acoustic information corresponding to the music, the tones, and/or the speech to be generated by the speaker 2. In general, the audio signal comprises information about the sound waves to be generated by the speaker 2. A quality of the sound waves generated by the speaker 2, particularly a sound quality, can depend on the device 1 deflecting the piezoelectric actuator to match the digital audio signal.

The device 1 according to the present embodiment example comprises a digital correction unit 4 by means of which the nonlinearity of the piezoelectric speaker 2 can be corrected. Nonlinearities can occur, for example, because a change in the deflection of the piezoelectric actuator depends on the momentary deflection of the piezoelectric actuator itself. The capacitance of the piezoelectric actuator can also depend on the deflection and is thus also a source of nonlinearity. When determining the voltage with which the piezoelectric actuator is charged, for example, the momentary voltage must also be considered. The nonlinearities can therein have a plurality of causes. A size; the temperature, or an age of the piezoelectric actuator can also be considered. In addition or alternatively, however, the device 1 itself can also lead to nonlinearities of the speaker 2.

The digital correction unit 4 can receive the digital audio signal and output a corrected signal.

The device 1 further comprises a digital pulse width modulation (PWM) generator 5 by means of which the signal corrected by the correction unit 4 can be converted into a pulse-width modulated switch signal.

The device 1 further comprises a power stage 6 for actuating by means of the switch signal converted by the PWM generator 5, such that the piezoelectric actuator of the piezoelectric speaker 2 for deflecting the membrane can be charged with a voltage. The power stage 6 can be an amplifier unit, for example, which raises the voltage from 3V up to 30V. The power stage 6 can process the pulse-width modulated switch signal, such that the piezoelectric actuator of the speaker 2 is charged with the voltage. The voltage with which the piezoelectric actuator is charged therein depends on the pulse-width modulated switch signal. The voltage of the actuator can be adjusted by means of the pulse-width modulated switch signal. The voltage is therein adjusted such that the piezoelectric actuator is charged such that the membrane is deflected such that a sound matching the digital audio signal is produced.

The power stage 6 can thereby be supplied with electrical energy by a power supply 8 in order to charge the piezoelectric actuator or piezoelectric speaker 2. The power supply 8 can be a battery of a smartphone, for example.

In order to implement a closed-loop control circuit, the device 1 comprises a feedback 7 by means of which the voltage of the piezoelectric actuator can be fed back as a feedback signal.

The feedback 7 can be fed back to a first summing register 10. The first summing register 10 can be implemented such that said register 10 compares the feedback signal to the digital audio signal. The first summing register 10 can output a difference between the feedback signal and the digital audio signal, for example. As the first summing register 10 outputs a difference between the two signals, the first summing register 10 can also be a subtraction point. An error or deviation between the audio signal and the voltage at the piezoelectric actuator can thereby be determined, corresponding to a deviation between the specified value, representing the digital audio signal, and the momentary value, representing the voltage at the piezoelectric actuator.

Before the feedback signal is fed back to the first summing register 10, said feedback signal can be fed back to an analog/digital converter 9 (or A/D converter for short). The feedback signal can be digitalized by the A/D converter 9 in order to be able to process said feedback signal in an electronic or logical circuit.

The feedback signal comprises a first signal noise in the audible frequency range of the sound waves produced by the piezoelectric speaker 2 during normal operation, caused by the correction unit 4, the PWM generator 5, the power stage 6, and/or the piezoelectric speaker 2.

The first signal noise can arise from a quantization noise or quantization error, for example. The correction unit 4, the PWM generator 5, the power stage 6, and/or the piezoelectric speaker 2 can describe the digital/analog converter (or D/A converter for short), as said items convert a digital audio signal at the signal input 3 into a voltage of the piezoelectric actuator, wherein said voltage is analog. The correction unit 4, the PWM generator 5, and the power stage 6 can be summarized as a D/A converter, as said items convert a digital audio signal into an output signal for the piezoelectric speaker 2. Converting from the digital audio signal into the voltage of the actuator or the output signal for the speaker 2, the quantization errors can occur, leading to the first signal noise and potentially leading to a reduced sound quality in the audible frequency range.

The device 1 further comprises a forward path 13. The forward path 13 in the present embodiment comprises the signal input 3, the digital correction unit 4, the PWM generator 5, and the power stage 6. In addition, the forward path 13 also comprises the piezoelectric speaker 2, although said speaker is not disposed in a line with the other elements of the forward path 13 in FIG. 1. The power supply 8 can also be part of the forward path 13.

The device 1 additionally or alternatively comprises a feedback path 14. The feedback path 14 here comprises the A/D converter 9 for receiving, digitalizing, and feeding back the feedback signal from the piezoelectric speaker 2.

The forward path 13 and the feedback path 14 can form the closed-loop control circuit.

The device 1 or the closed-loop control circuit further comprises a signal flow 15, wherein the direction of signal flow is marked in the figures by the arrows. The signal flow 15 runs, for example, from the signal input 3 through the first summing register 10, through the correction unit 4, through the PWM generator 5, through the power stage 6, to the piezoelectric speaker 2, wherein said flow can form the forward path 13. The signal flow 15 further runs from the piezoelectric speaker 2 through the A/D converter 9, back to the signal input 3 or the first summing register 10, wherein said flow can form the feedback path. The signal flow 15 is thus run in a closed-loop control circuit.

Figure 2:
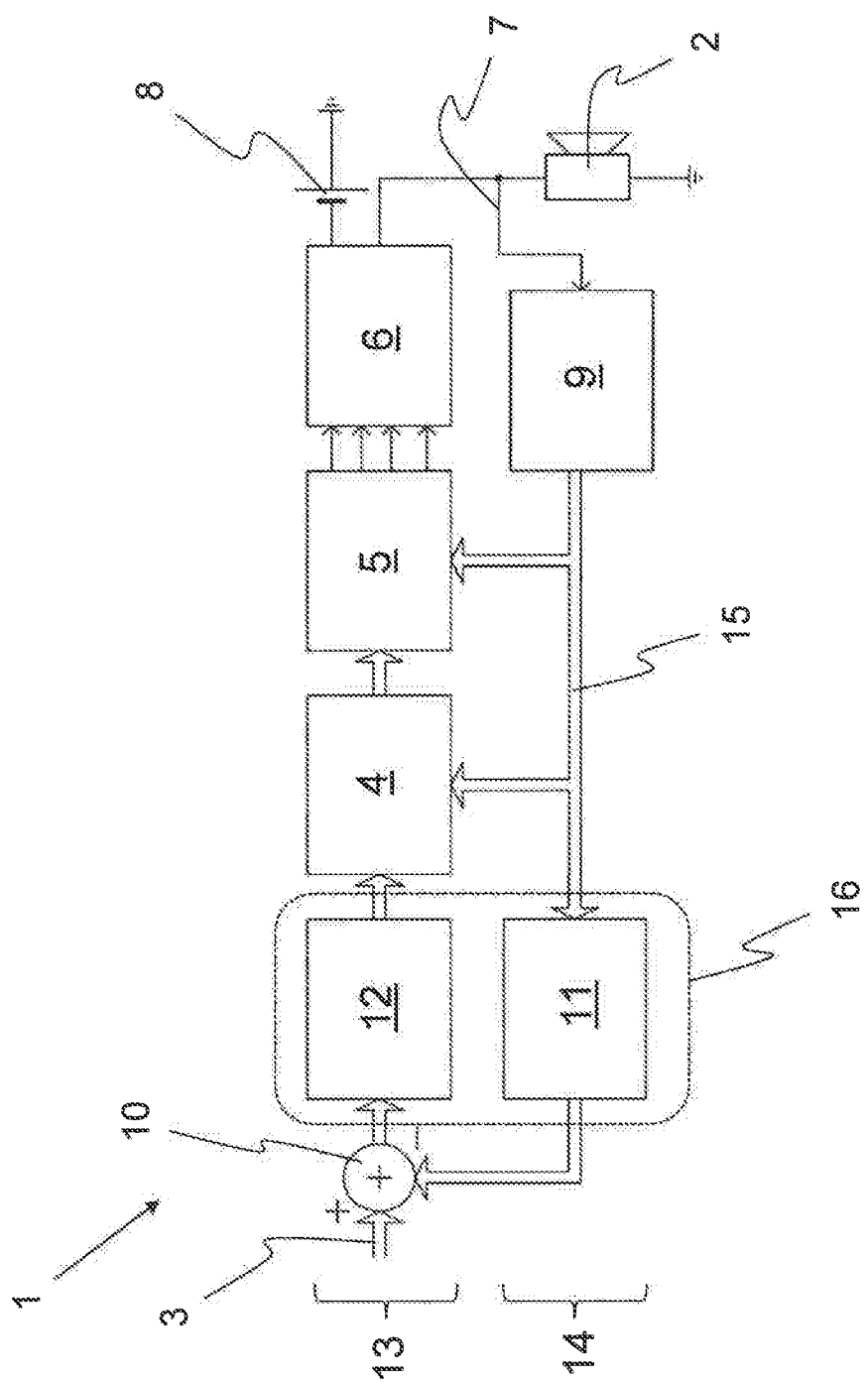

FIG. 2 shows a block circuit diagram of a device 1 for audio signal processing for the piezoelectric speaker 2. The device 1 comprises a noise shaping unit 16 implemented such that the noise shaping of the first signal noise of the correction unit 4, of the PWM generator 5, of the power stage 6, and/or of the piezoelectric speaker 2 can be shifted outside of the audible frequency range by means thereof. For example, the noise energy of the first signal noise can be shifted into a range above the audible frequency range. The audible frequency range ends at about 20 kHz, so that the noise energy of the first signal noise, when shifted there, can no longer be perceived by the human ear. For example, the noise energy can be shifted into a frequency range higher than 20 kHz or higher than 100 kHz. The noise shaping unit 16 desirably can include a central processor or a controller/control unit of the device 1 or at least a part of the processor or of the controller (a sub-processor), The noise shaping unit 16 desirably can be an Application Specific Integrated Circuit (ASIC) or can be a part of the ASIC. Additionally, the correction unit 4, each summing register 10, 17 and/or the PWM-generator 5 also can be part of the processor or of the controller of the noise shaping unit 16, for example as software or hard-wired in the ASIC.

The noise energy of the first signal noise can therein also be shifted into a frequency range of a system sampling frequency of the device 1. The system sampling frequency can be the working frequency of the device 1, for example. Said frequency can be in the range of 1 MHz, for example. At such high frequencies, the noise energy of the first signal noise can also be damped, as the piezoelectric actuator cannot follow such high frequencies. The piezoelectric actuator can therefore comprise properties of a low-pass filter.

The noise shaping unit 16 can be connected upstream of the correction unit 4 in the direction of the signal flow 15 according to the present embodiment example. For example, the noise shaping unit 16 can be disposed in the forward path 13 and/or in the feedback path 14. The noise shaping unit 16 is further connected downstream of the A/D converter 9 in the direction of the signal flow 15.

The noise shaping unit 16 can further comprise a noise shaping block 11 and/or a, particularly digital, loop filter 12, according to the present embodiment example. The noise energy of the first signal noise can be shifted outside the audible frequency range by means of the noise shaping block 11. The noise shaping block 11 is disposed here in the feedback path 14. The noise shaping block 11 is further connected downstream of the A/D converter 9 in the direction of the signal flow 15. The noise shaping block 11 is further connected upstream of the signal input 3 in the direction of the signal flow 15. The noise shaping block 11 thus shifts the noise energy outside of the audible frequency range in one method. The signal shaped by the noise shaping block 11 and/or the noise shaping unit 16 is then fed to the first summing register 10 according to the method.

The loop filter 12 is disposed in the forward path 13. The loop filter 12 is further connected downstream of the signal input 3 in the direction of the signal flow 15. The loop filter 12 is connected upstream of the correction unit 4 in the direction of the signal flow 15.

Figure 3:
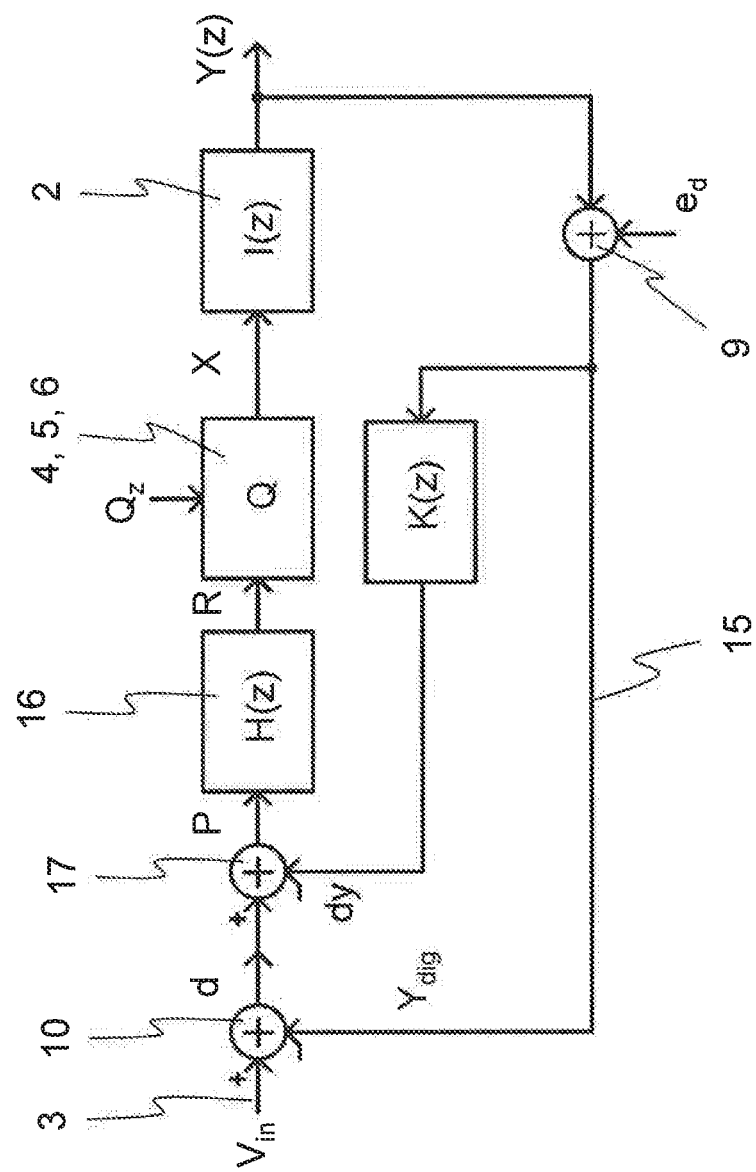

FIG. 3 shows a flow chart for audio signal processing for the piezoelectric speaker 2.

The digital audio signal $V_{in}$ can be fed into the signal input 3. The first summing register 10 follows downstream of the signal input 3 in the direction of the signal flow 15. The digital audio signal $V_{in}$ can be compared with a digital feedback signal $Y_{dig}$ at the first summing register 10. For example, a difference can be formed from the two signals. For example, $d=V_{in}-Y_{dig}$ can be formed. The digital feedback signal $Y_{dig}$ of a previous system cycle of the device 1 can therein advantageously be compared with the momentary digital audio signal $V_{in}$. For example, $d=V_{in}(n)-Y_{dig}(n-1)$ can be determined. The control deviation can thus be d. The value d is also the amount by which the voltage of the piezoelectric speaker 2 must be adjusted. This can be zero, if a voltage is present at the piezoelectric actuator of the speaker 2 and should be present in order to generate the corresponding sound according to the digital audio signal $V_{in}$. Due to errors, however, such as due to the nonlinearities of the piezoelectric speaker 2, the first signal noise $Q_z$, and/or a second signal noise $e_d$, a control deviation d unequal to zero can occur.

The control deviation d is fed to a second summing register 17 in the direction of the signal flow 15. The control deviation d can be compared with a voltage change dy of the piezoelectric speaker 2 in the second summing register 17. A difference dy in successive voltages of the piezoelectric speaker 2 can be defined. For example, the second summing register 17 can form a difference between the control deviation d and the change in voltage dy. For example, P=d−dy can be formed according to the present example.

The input signal P can be fed into the noise shaping unit 16 in the direction of the signal flow 15. The noise shaping unit 16 can be programmed to include a system function H(z). The noise shaping unit 16 can further be programmed to include a signal transfer function $STF_d$ defined according to a first formula:

$$STF_d = \frac{X}{d} = \frac{H(z)}{[1 + I(z) * (1 + K(z))H(z)]}$$

The signal transfer function $STF_d$ can describe the behavior as the control deviation d changes to an actuating variable X, preferably for a linear system. In the formula or formulas, H(z) is the system function, I(z) is the speaker function, K(z) is the inverse function of I(z), d is the control deviation, and X is the actuating variable for the speaker. X can thus be the voltage by means of which the speaker 2 is charge and can be analog.

The control deviation d can further be shifted by a period of the system sampling frequency or the working frequency by means of the signal transfer function $STF_d$. The control deviation d can thereby be delayed by one period. Different H(z) can produce different $STF_d$.

A digital/analog converter Q is disposed in the direction of the signal flow 15 for the noise shaping unit 16 and can comprise the digital correction unit 4, the PWM converter 5, and the power stage 6. The input signal R can be provided to the digital/analog converter Q. The input signal R can be defined as R=(d−dy)H(z)=P*H(z). The digital/analog converter Q further comprises the disturbance variable $Q_z$, leading schematically into the digital/analog converter Q in FIG. 3. The disturbance variable $Q_z$ corresponds here to the first signal noise $Q_z$ potentially implemented by the correction unit 4, the PWM generator 5, the power stage 6, and/or the piezoelectric speaker 2.

The processing of the first signal noise $Q_z$ can be described by means of a noise shaping transfer function $NTF_d$, wherein said processing of the first signal noise $Q_z$ can be implemented by the noise shaping unit 16, which can further be programmed to include the noise shaping transfer function $NTF_d$ defined for example according to a second formula as follows:

$$NTF_d = \frac{X}{Q_z} = \frac{1}{[1 + I(z)*(1 + K(z))H(z)]}$$

The noise shaping unit 16 desirably can further be programmed to include an actuating variable transfer function X(z) defined for example according to a third formula for a particular selection of H(z)

$$X(z) = V_{in}*STF_d + Q_z*NTF_d = z^{-1}*d + Q_z*(1-z^{-1})$$

The signal transfer function therein is $STF_d$ and the noise shaping transfer function is $NTF_d$. X(z) depends on the choice of the system function H(z).

The noise shaping unit 16 desirably can further be programmed to include a controlled variable transfer function Y(z) that is defined for example according to the following fourth formula for a particular selection of H(z):

$$Y(Z) = V_{in}\frac{STF_d*I(z)}{(1+STF_d*I(z))} + Q_z\frac{NTF_d*I(z)}{(1+NTF_d*I(z))} = V_{in}*z^{-1} + Q_z(1-z^{-1})$$

According to the said fourth formula, the noise energy of the first signal noise $Q_z$ can be damped in the audio band. The noise energy of the first signal noise $Q_z$ can be shifted into a high frequency range, wherein the human ear can no longer perceive the noise energy of the first signal noise $Q_z$ and therefore the sound quality is improved. Y(z) depends on the choice of the system function H(z).

The controlled variable Y(z) in the form of the voltage of the piezoelectric speaker 2 can be digitalized by means of the A/D converter 9. A quantization error or a quantization noise can occur due to the digitalization and is present in the second signal noise $e_d$. If the resolution of the A/D converter 9 is selected to be high enough, for example 12 bits, 14 bits, or 16 bits, then the second signal noise $e_d$ can be negligible. Only the first signal noise $Q_z$ can, for example, be shifted out of the audible frequency range by means of the noise shaping unit 16.

The present invention is not limited to the exemplary embodiments shown and described. Modifications in the context of the patent claims are also possible, as is a combination of features, even if these are shown and described in different exemplary embodiments.

REFERENCE LIST

1 Device for audio signal processing
2 Piezoelectric speaker
3 Signal input
4 Digital correction unit
5 Digital PWM generator
6 Power stage
7 Feedback
8 Power supply
9 Analog/digital converter
10 First summing register
11 Noise shaping block
12 Loop filter
13 Forward path
14 Feedback path
15 Signal flow
16 Noise shaping unit
17 Second summing register
$V_{in}$ Digital audio signal
d Control deviation
dy Voltage change at piezoelectric speaker
P Noise shaping unit input signal
R Digital/analog converter input signal
$Q_z$ First signal noise
Q Digital/analog converter
X Actuating variable
I(z) Speaker function
Y(z) Controlled variable
H(z) System function
K(z) Inverse function of I(z)
$e_d$ Second signal noise
$Y_{dig}$ Digital feedback signal
$STF_d$ Signal transfer function
$NTF_d$ Noise shaping transfer function

What is claimed is:

1. A device for audio signal processing for a piezoelectric speaker having a piezoelectric actuator and a membrane for generating sound waves in the audible wavelength spectrum, the audio signal processing device comprising:
   a signal input configured for receiving a digital audio signal,
   a digital correction unit connected to the signal input and configured for correcting a nonlinearity of the digital audio signal,
   a digital PWM generator configured for converting the corrected signal generated by the correction unit into a pulse-width modulated switch signal,
   a power stage connected to the PWM generator and configured for charging the piezoelectric actuator of the speaker with a deflection voltage for deflecting the membrane, and wherein the power stage is configured to be able to be controlled by means of the switch signal converted by the PWM generator, and wherein the power stage is connected to the signal input to form a closed-loop control circuit, by means of which the deflection voltage can be fed back to the signal input as a feedback signal,
   wherein the feedback signal comprising a first signal noise caused by the digital correction unit, the PWM generator, the power stage, and/or the piezoelectric speaker when used properly in the audible frequency range, and
   a noise shaping unit designed and/or implemented in the closed-loop control circuit such that a noise energy of the first signal noise of the correction unit, the PWM generator, the power stage, and/or the piezoelectric speaker can be shifted outside of the audible frequency range by means of said noise shaping unit.

2. The device according to claim 1, wherein the noise shaping unit is configured for shifting the noise energy of the first signal noise into a high-frequency range and/or into the range of a system sampling frequency of 1 MHz.

3. The device according to claim 1, wherein the closed-loop control circuit comprises a forward path and a feedback path.

4. The device according to claim 1, wherein the noise shaping unit is connected upstream of the correction unit in the direction of signal flow.

5. The device according to claim 1, wherein the noise shaping unit Includes a noise shaping block and/or a loop filter, wherein the noise shaping block is configured for shifting the noise energy of the first signal noise, wherein the loop filter is configured for suppressing closed-loop control circuit oscillations.

6. The device according to claim 1, wherein the device comprises an analog/digital converter by means of which the feedback signal can be digitalized, wherein the converted digital feedback signal comprises a second signal noise caused by the analog/digital converter.

7. The device according to claim 1, wherein the noise shaping block is designed for processing only the first signal noise.

8. The device according to claim 1, wherein the noise shaping unit comprises a signal transfer function by means of which an actuating variable for actuating the piezoelectric speaker can be determined using a control deviation between the digital audio signal and the digital feedback signal.

9. The device according to claim 8, wherein the signal transfer function is implemented such that the control deviation (d) can be delayed by one period by means thereof.

10. The device according to claim 8, wherein the signal transfer function is defined by the following first formula:

$$[[STF]]\_d = X/d = (H(z))/([1+I(z)*(1+K(z))H(z)]),$$

wherein $H(z)$ is the system function, $I(z)$ is a speaker function, $K(z)$ is the inverse function of $I(z)$, d is the control deviation, and X is the actuating variable for the piezoelectric speaker.

11. The device according to claim 1, wherein the noise shaping unit comprises a noise shaping transfer function by means of which the noise energy of the first signal noise can be shifted.

12. The device according to claim 11, wherein the noise shaping transfer function is implemented such that low frequencies are damped by means thereof.

13. The device according to claim 11, wherein the noise shaping transfer function is defined by the following second formula:

$$[[NTF]]\_d = X/Q\_z = 1/([1+I(z)*(1+K((z))H(z)]),$$

wherein $H(z)$ is the system function, $I(z)$ is a speaker function, $K(z)$ is the inverse function of $I(z)$, d is the control deviation, and X is the actuating variable for the piezoelectric speaker.

14. The device according to claim 1, wherein the noise shaping unit includes an actuating variable transfer function $(X(z))$ that is defined by the following third formula:

$$X(z) = d*STF_d + Q_z*NTF_d.$$

15. The device according to claim 1, wherein the noise shaping unit includes a controlled variable transfer function $(Y_{(z)})$ that is defined by the following fourth formula:

$$Y(Z) = V_{in} \frac{STF_d * I(z)}{(1+STF_d*I(z))} + Q_z \frac{NTF_d * I(z)}{(1+NTF_d*I(z))}.$$

16. The device according to claim 1, wherein the noise shaping unit is implemented such that the zeroes, poles, and/or order of at least one transfer function can be determined by means thereof such that a signal-to-noise ratio can be increased and/or a harmonic distortion can be reduced.

17. The device according to claim 1, further comprising a computing or controlling unit configured for implementing a signal transfer function, a noise shaping transfer function, an actuating variable transfer function $(X(z))$, and/or a controlled variable transfer function $(Y(z))$.

18. The device according to claim 1, wherein the digital correction unit is configured for storing measurement data of a standardized piezoelectric speaker for describing the nonlinear behavior thereof, and the digital correction unit is configured for correcting that part of the nonlinearity of the speaker by applying said measurement data.

19. A device for audio signal processing for a piezoelectric speaker having a piezoelectric actuator and a membrane for generating sound waves in the audible wavelength spectrum, the audio signal processing device comprising:
   a signal input configured for receiving a digital audio signal;
   a digital correction unit connected to the signal input and configured for correcting a nonlinearity of the digital audio signal and generating a corrected digital audio signal;
   a digital pulse width modulation generator connected to the digital correction unit and configured for converting the corrected digital audio signal into a pulse-width modulated switch signal;
   a power stage connected to the pulse width modulation generator and configured for connection to the piezoelectric speaker, the power stage being configured for charging the piezoelectric actuator of the piezoelectric speaker with a deflection voltage for deflecting the membrane, and wherein the power stage is configured to be able to be controlled by means of the switch signal converted by the pulse width modulation generator;
   a feedback connected to the power stage and configured for connection to the piezoelectric speaker;
   an analog-to-digital converter connected to the feedback and configured for converting the deflection voltage to a digital feedback signal, which includes a signal noise caused by at least one of the digital correction unit, the pulse width modulation generator, the power stage, and the piezoelectric speaker;
   a summing register connected to the analog-to-digital converter and connected between the signal input and the digital correction unit and configured for determining the difference between the digital feedback signal and the digital audio signal; and
   a noise shaping unit connected between the summing register and the digital correction unit and/or connected between the summing register and the analog-to-digital converter, wherein the noise shaping unit is configured to shift the frequency of the first signal noise outside of the audible frequency range.

20. A method for audio signal processing for a piezoelectric speaker for generating sound waves in the audible wavelength spectrum, the method comprising the steps of:
   a digital audio signal fed in via a signal input being processed,
   a nonlinearity of the speaker being corrected by a digital correction unit,
   the signal corrected by the correction unit being converted into a pulse-width modulated switch signal by a digital PWM generator,
   a power stage being actuated by means of the switch signal converted by the PWM generator such that a piezoelectric actuator of the speaker is charged with a voltage for deflecting a membrane, and the voltage being fed back as a feedback signal-via a feedback of a closed-loop control circuit, the feedback signal comprising a first signal noise caused by the correction unit, the PWM generator, the power stage, and/or the piezoelectric speaker when used properly in the audible frequency range, using a noise shifting unit to shift a noise energy of the first signal noise of the correction unit, the PWM generator, the power stage, and/or the piezoelectric speaker out of the audible frequency range.

* * * * *